United States Patent
Kubokawa et al.

(10) Patent No.: US 6,929,169 B2
(45) Date of Patent: Aug. 16, 2005

(54) SOLDER JOINT STRUCTURE AND METHOD FOR SOLDERING ELECTRONIC COMPONENTS

(75) Inventors: Teruyoshi Kubokawa, Fukushima-ken (JP); Kunio Kosaka, Fukushima-ken (JP); Takafumi Nomura, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/676,939

(22) Filed: Oct. 1, 2003

(65) Prior Publication Data

US 2004/0065718 A1 Apr. 8, 2004

(30) Foreign Application Priority Data

Oct. 2, 2002 (JP) ........................................ 2002-289865
Jun. 23, 2003 (JP) ........................................ 2003-178118

(51) Int. Cl.[7] ............................................. B23K 31/02
(52) U.S. Cl. ................................. 228/180.1; 228/248.1
(58) Field of Search ......................... 228/180.1, 180.22, 228/245, 248.1; 148/24; 361/760, 772, 774, 777; 428/643, 644

(56) References Cited

U.S. PATENT DOCUMENTS

| 3,711,628 | A | * | 1/1973 | Hansson | ................ | 174/71 R |
| 5,390,080 | A | * | 2/1995 | Melton et al. | ............... | 361/765 |
| 5,452,842 | A | * | 9/1995 | Melton et al. | ......... | 228/180.22 |
| 6,680,128 | B2 | * | 1/2004 | Mei | ........................... | 428/570 |
| 6,814,276 | B2 | * | 11/2004 | Yamaguchi | ................. | 228/208 |
| 2003/0178476 | A1 | * | 9/2003 | Kanai et al. | ............. | 228/248.1 |
| 2004/0155336 | A1 | * | 8/2004 | Yamaguchi et al. | ........ | 257/736 |

FOREIGN PATENT DOCUMENTS

| JP | 2000-079494 | 3/2000 |
| JP | 2002-066783 | 3/2002 |
| JP | 2002-158438 | 5/2002 |

* cited by examiner

*Primary Examiner*—Jonathan Johnson
(74) *Attorney, Agent, or Firm*—Brinks Hofer Gilson & Lione

(57) ABSTRACT

A method for soldering an electronic component is provided. A first solder land containing copper and a second solder land are formed on a surface of a circuit board. A first solder section composed of a Sn—Ag—Cu solder material is formed on each of the first and the second solder lands, and a terminal of an electronic component chip is mounted on the first solder land. The first solder land and the terminal are fusion-bonded. A second solder section composed of a Sn—Zn solder material is formed on the first solder section disposed on the second solder land. A lead terminal of another electronic component is inserted into a terminal hole formed near the second solder land; and the second solder section and the lead terminal are heated at a temperature lower than the previous temperature to connect the lead terminal to the second solder section by fusion bonding.

3 Claims, 4 Drawing Sheets

SOLDER JOINT STRUCTURE AND METHOD FOR SOLDERING ELECTRONIC COMPONENTS

This application claims the benefit of priority to Japanese Patent Application No. 2002-289865, filed on Oct. 2, 2002 and Japanese Patent Application No. 2003-178118, filed on Jun. 23, 2003, incorporated herein by reference.

BACKGROUND OF THE INVENTION

1. Field of the Invention

The present invention relates to a solder joint structure suitable for use in lead-free soldering of an electronic component having a low heat resistance and to a method of soldering electronic components.

2. Description of the Related Art

In soldering terminals of various electronic components onto solder lands of print circuit boards, a Sn—Pb eutectic solder, e.g., 63Sn-37Pb solder, has been widely used. As the use of lead-free solder materials increases to avoid environmental pollution, various proposals of solder materials that meet the demand for lead-free soldering are made. Among such proposals, Sn—Ag—Cu solder materials are drawing much attention since they have superior thermal fatigue characteristics and creep property (e.g., Japanese Unexamined Patent Application Publication No. 2002-158438). Whereas Sn—Pb eutectic solder melts at 183° C., the melting point of Sn—Ag—Cu solder materials is higher, i.e., approximately 220° C. Accordingly, Sn—Ag—Cu solder materials are not preferred in soldering electronic components having relatively low heat resistance. For example, there are a large number of lead-terminal-mount electronic components that cannot withstand temperatures above approximately 200° C. The terminals of such electronic components cannot be soldered with Sn—Ag—Cu solder materials having the melting point of approximately 220° C.

Meanwhile, a tin-zinc (Sn—Zn) solder material has been known as a lead-free solder material suitable for soldering thermolabile electronic components (e.g., Japanese Unexamined Patent Application Publication No. 2002-66783). The Sn—Zn solder material is an alloy prepared by adding 8 percent by weight of zinc and 3 percent by weight of bismuth to tin, i.e., a Sn-8Zn-3Bi alloy. Since, the melting point of the alloy is low, i.e., approximately 200° C., the molten Sn—Zn solder can be joined with the terminal of the thermolabile electronic component without inflicting any problem. However, a temperature cycling test in which the Sn—Zn solder material is applied on a patterned conductor containing copper, e.g., a copper foil, reveals that the joint strength decreases due to the interaction between copper and zinc and that the reliability of soldering is seriously degraded as a result. In other words, required reliability cannot be achieved if soldering is performed by directly applying the Sn—Zn solder material on a solder land, i.e., a patterned copper foil, on a print circuit board.

In order to overcome this problem, as shown in FIG. 7, a method whereby underlayers, namely, a nickel plating layer 3 and a thin gold plating layer 4, are formed on a patterned copper foil 2 of a print circuit board 1 before performing low-melting-point soldering on the gold plating layer 4 using a Sn—Zn solder 5 has been employed. The nickel plating layer 3 prevents zinc from diffusing into the patterned copper foil 2. The gold plating layer 4 covers the nickel plating layer 3 having poor solder wettability to secure joint with the Sn—Zn solder 5. A terminal hole 6 is formed in the patterned copper foil 2 on the print circuit board 1. After the Sn—Zn solder 5 is applied on the gold plating layer 4, a lead terminal 31 of a thermolabile electronic component is inserted into the terminal hole 6 and is heated in a reflow furnace at approximately 200° C. so as to connect the lead terminal 31 to the Sn—Zn solder 5 by fusion bonding.

According to this solder joint structure in which the Sn—Zn solder 5 is formed on the patterned copper foil 2 with the nickel plating layer 3 and the gold plating layer 4 therebetween, a decrease in joint strength resulting from the interaction between copper and zinc can be avoided, thereby achieving reliable soldering of thermolabile electronic components using lead-free solder materials.

The conventional solder joint structure shown in FIG. 7 simultaneously achieves reliable soldering of thermolabile electronic components while avoiding environmental pollution resulting from use of lead and reliable soldering of thermolabile electronic components. However, since the nickel plating layer 3, which has poor solder wettability, must be coated with the gold plating layer 4, material cost is high, and the process requires extra steps. Thus, increased cost has been a problem.

SUMMARY OF THE INVENTION

The present invention aims to overcome the problem experienced in the conventional art. A first object of the present invention is to provide a lead-free solder joint structure that can achieve reliable soldering of thermolabile electronic components at low cost. A second object of the present invention is to provide a method for soldering electronic components, whereby reliable lead-free soldering can be achieved at low cost in mounting both heat-resistant electronic components and thermolabile electronic components onto a print circuit board.

In order to achieve the first object, the present invention provides a solder joint structure that includes a patterned conductor containing copper; a solder base section composed of a Sn—Ag—Cu solder material or a Sn—Ag solder material; and a solder joint section composed of a Sn—Zn solder material. The solder joint section is disposed on the solder base section, and the solder joint section connects with a terminal of an electronic component by fusion bonding.

In this solder joint structure, when the solder base section is composed of the Sn—Ag—Cu solder material, the Sn—Ag—Cu solder material may be free of additives or may contain at least one additive selected from antimony, nickel, phosphorus, germanium, and gallium. When the solder base section is composed of the Sn—Ag solder material, the Sn—Ag solder material preferably contains at least one additive selected from antimony, nickel, phosphorus, germanium, gallium, aluminum, cobalt, chromium, iron, manganese, palladium, and titanium.

According to this solder joint structure in which the lead-free solder joint section is formed on the patterned conductor, such as patterned copper foil, containing copper with the lead-free solder base section therebetween, a decrease in joint strength resulting from the interaction between copper and zinc can be avoided due to the presence of the solder base section. As a result, high reliability can be achieved without having to form expensive gold plating layers. Accordingly, reliable soldering of thermolabile electronic components by low-melting-point Sn—Zn solder can be achieved at low cost.

In order to achieve the second object, the present invention provides a method for soldering an electronic component, the method including (a) forming a first solder land, which is a patterned conductor, containing copper and a second solder land, the first solder land and the second solder land being formed on the same surface of a circuit board; (b) forming a first solder section on each of the first solder land and the second solder land, the first solder section composed of a Sn—Ag—Cu solder material or Sn—Ag solder material; (c) mounting a terminal of an electronic component chip on the first solder land; (d) heating the first solder land and the terminal to connect each other by fusion bonding; (e) forming a second solder section on the first solder section disposed on the second solder land, the second solder section composed of a Sn—Zn solder material; (f) inserting a lead terminal of another electronic component into a terminal hole formed near the second solder land; and (g) heating the second solder section and the lead terminal at a temperature lower than the temperature in step (d) so as to connect the lead terminal to the second solder section by fusion bonding.

In this soldering method, when the first solder section is composed of the Sn—Ag—Cu solder material, the Sn—Ag—Cu solder material may be free of additives or may contain at least one additive selected from antimony, nickel, phosphorus, germanium, and gallium. When the first solder section is composed of the Sn—Ag solder material, the Sn—Ag solder material preferably contains at least one additive selected from antimony, nickel, phosphorus, germanium, gallium, aluminum, cobalt, chromium, iron, manganese, palladium, and titanium.

According to this method, the first solder section is first formed on the first solder land, and a terminal of a heat-resistant electronic component chip is then mounted on the first solder land. When heated, highly reliable lead-free soldering can be performed. Soldering of thermolabile electronic components must be performed after the soldering of the electronic component chip. In this method, the first solder section is simultaneously formed on both the second solder lands and the first solder lands. Thus, the second solder section having a low melting point can be formed on the first solder section, i.e., the underlayer, on the second solder land. Thus, reliable fusion bonding between the lead terminal of the thermolabile electronic component and the second solder section can be achieved. In particular, a decrease in joint strength resulting from the interaction between copper and zinc can be prevented due to the presence of the first solder section, i.e., the underlayer. Reliable soldering of the thermolabile electronic components can be performed using the lead-free Sn—Zn solder without having to form costly gold plating layers. Moreover, no additional step of forming an underlayer for the second solder section is necessary since the first solder section is already formed.

DESCRIPTION OF THE PREFERRED EMBODIMENTS

Figure 1:
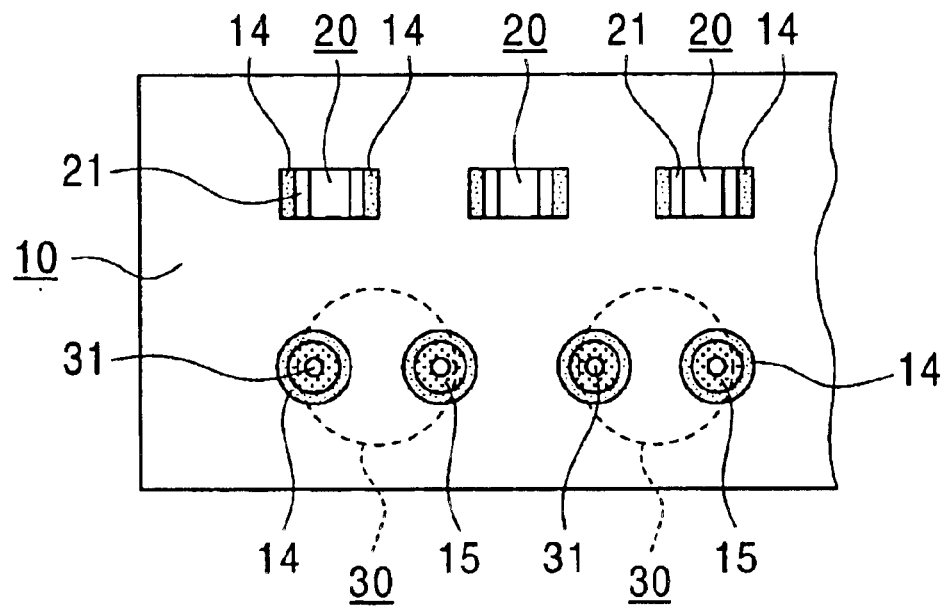
FIG. 1 shows a circuit board having various electronic components mounted thereon according to an embodiment of the present invention.
Figure 2:
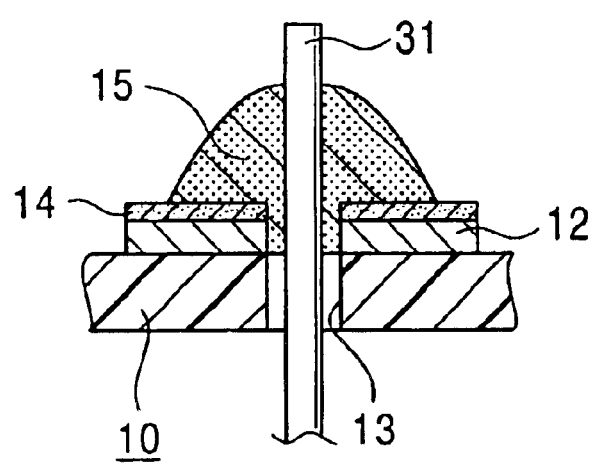
FIG. 2 is a cross-sectional view of a solder joint structure for a lead terminal of a thermolabile electronic component shown in FIG. 1.
Figure 3:
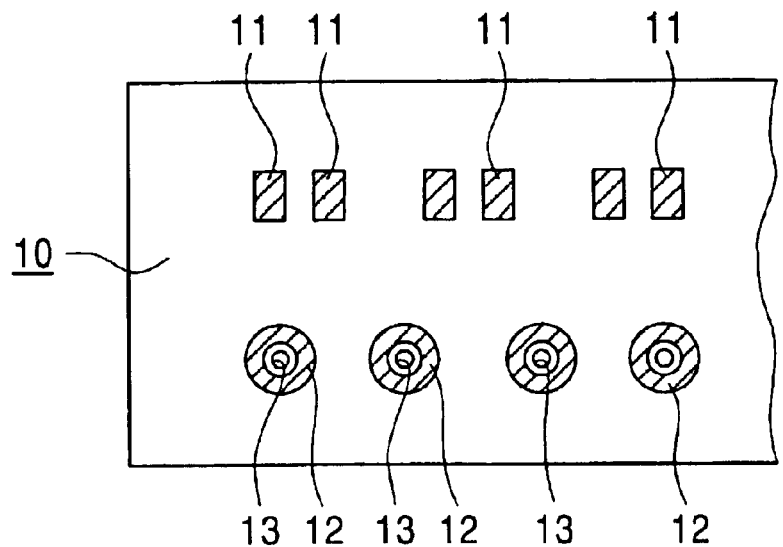
FIG. 3 shows lands on the circuit board.
Figure 4:
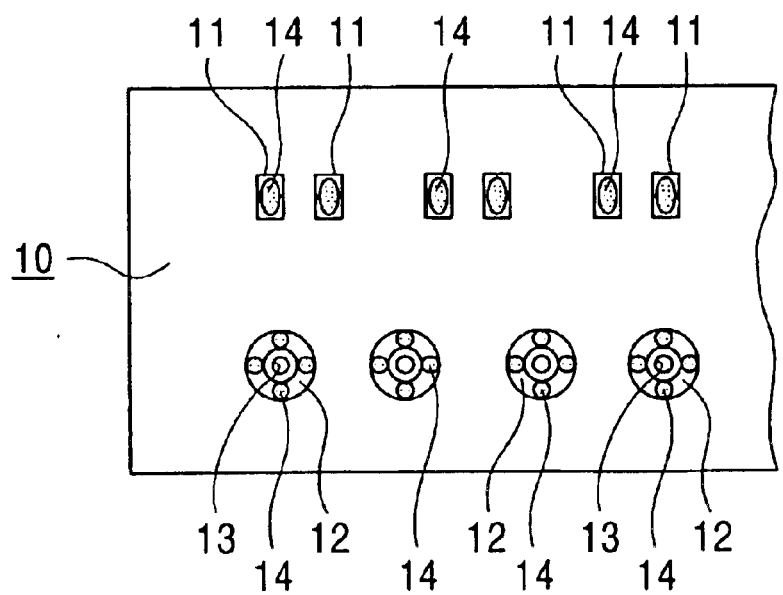
FIG. 4 shows the lands on the circuit board, in which a Sn—Ag—Cu solder is applied on the lands by printing.
Figure 5:
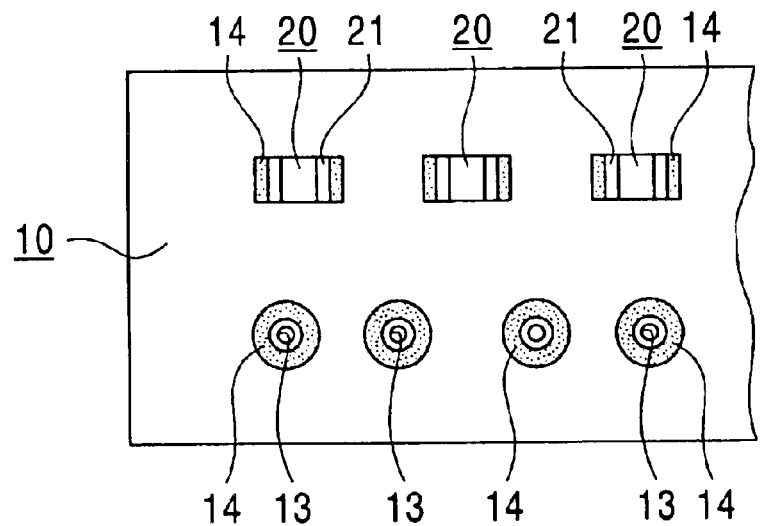
FIG. 5 shows the circuit board having electronic component chips mounted thereon.
Figure 6:
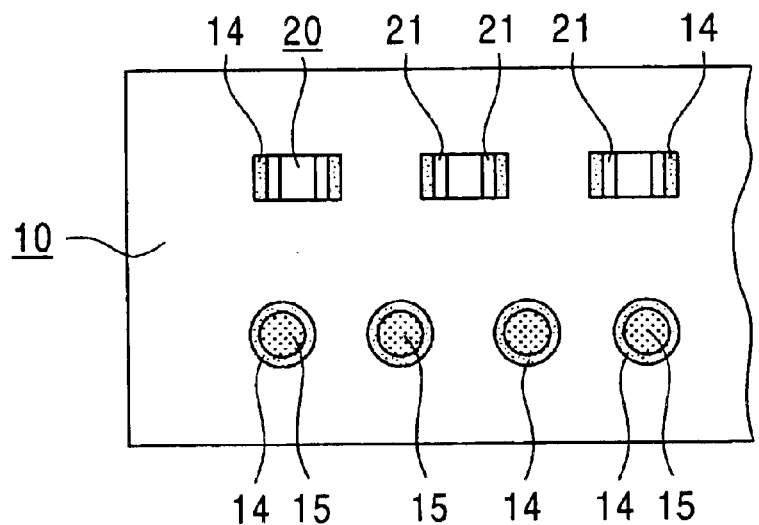
FIG. 6 shows the circuit board having second solder lands for lead terminals, in which a Sn—Zn solder is applied on the second solder lands by printing.
Figure 7:
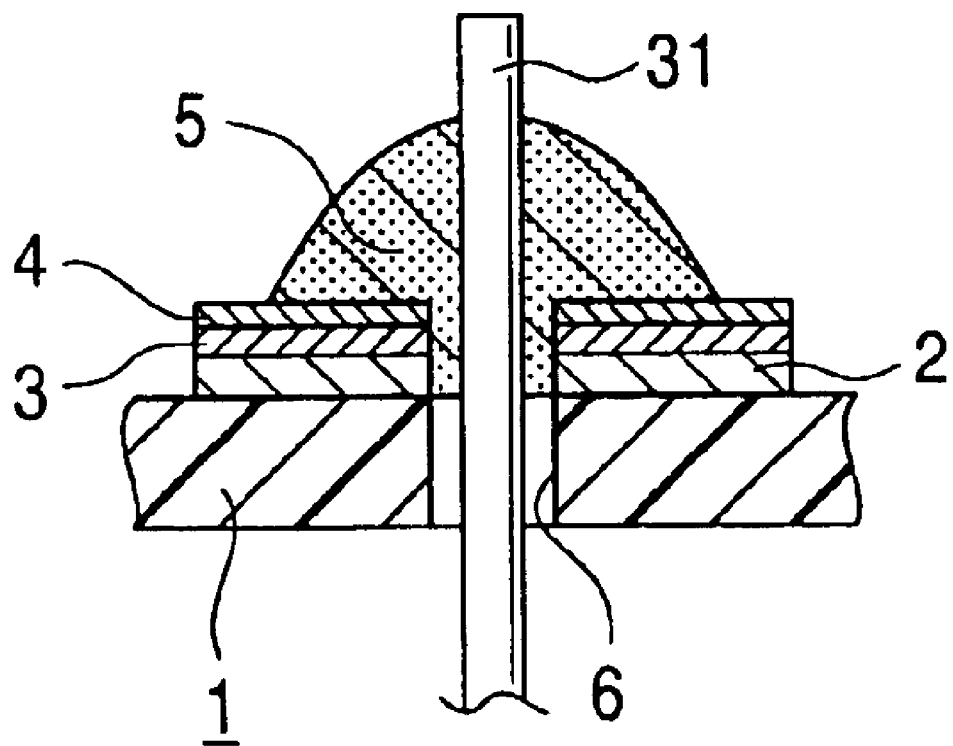
FIG. 7 is a cross-sectional view of a conventional solder joint structure using a Sn—Zn solder.

The preferred embodiments of the present invention will now be described with reference to the drawings. FIG. 1 shows a circuit board having various electronic components mounted thereon according to an embodiment of the present invention. FIG. 2 is a cross-sectional view of a solder joint structure for a lead terminal of a thermolabile electronic component. FIG. 3 shows lands on the circuit board. FIG. 4 shows the lands on the circuit board, in which a Sn—Ag—Cu solder material is applied on the lands by printing. FIG. 5 shows the circuit board having electronic component chips mounted thereon. FIG. 6 shows the circuit board having second solder lands for lead terminals, in which a Sn—Zn solder material is applied on the solder lands by printing.

As shown in FIG. 3, first solder lands 11 for surface mounting and second solder lands 12 for use with lead terminals are formed on the same surface of a circuit board 10. The first solder lands 11 are patterned copper layers. A terminal hole 13 is formed near each second solder land 12. A terminal 21 of a heat-resistant electronic component chip 20 will be mounted on each first solder land 11 and joined to the first solder land 11 by soldering. A terminal 31 of a thermolabile electronic component 30 inserted into the terminal hole 13 will be joined to the second solder land 12 by soldering.

In mounting the thermolabile electronic component 30 and the heat-resistant electronic component chip 20 onto the circuit board 10, the heat-resistant electronic component chip 20 is first mounted onto the circuit board 10 by soldering at a relatively high temperature, e.g., approximately 230° C. to avoid heat damage on the thermolabile electronic component 30. Subsequently, the thermolabile electronic component 30 is mounted by soldering at a lower temperature, e.g., approximately 200° C. In soldering the heat-resistant electronic component chip 20 and the thermolabile electronic component 30, lead-free solder materials are used to avoid environmental pollution.

In particular, a first solder section 14 composed of a Sn—Ag—Cu solder material is formed on each of the first solder lands 11 and the second solder lands 12 by printing, as shown in FIGS. 3 and 4. The solder material is mainly composed of Sn and contains 3 percent by weight of silver (Ag) and 0.5 percent by weight of copper (Cu). The melting point of the solder material is approximately 220° C.

Next, the terminal 21 of the heat-resistant electronic component chip 20 is mounted on each first solder section 14 disposed on the first solder land 11 and is heated at approximately 230° C. in a reflow furnace. As a result, the first solder section 14 connects with the terminal 21 by fusion bonding to end the process of mounting of the heat-resistant electronic component chip 20, as shown in FIG. 5. As is previously described, the lead-free Sn—Ag—Cu solder material, which has superior thermal fatigue characteristics and the like, securely solders the heat-resistant electronic component chip 20 on the first solder land 11 by fusion bonding between the first solder section 14 and the terminal 21.

Subsequently, as shown in FIG. 6, a second solder section 15 composed of a Sn—Zn solder material is formed, by means of printing, on each of the first solder sections 14 disposed on the second solder lands 12. The solder material is mainly composed of tin (Sn) and contains 8 percent by weight of zinc and 3 percent by weight of bismuth (Sn-8Zn-3Bi). The melting point is approximately 200° C. Bismuth is added because no solder alloy composed of Sn and Zn only can be used in in-air soldering.

Next, the terminal 31 of the thermolabile electronic component 30 is inserted into each terminal hole 13 formed near the second solder land 12 and is then heated at approximately 200° C. in a reflow furnace. As a result, as shown in FIG. 2, the terminal 31 connects with the second solder section 15 by fusion bonding, thereby completing the mounting of the thermolabile electronic component 30. As is previously described, the joint strength between the patterned copper foil and the Sn—Zn solder material directly applied on the patterned copper foil becomes degraded by the interaction between copper and zinc, the resulting junction thereby failing to achieve the desired characteristics. However, in this embodiment, the first solder section 14 prevents a decrease in joint strength resulting from the interaction between copper and zinc. According to this embodiment, the thermolabile electronic component 30 can be securely soldered on the second solder land 12 by using a lead-free low-melting-point solder material, i.e., the second solder section 15, without having to use expensive gold plating layers.

In this embodiment, the first solder section 14 is also formed on each of the second solder lands 12. The first solder section 14 disposed on each second solder land 12 functions as the underlayer of the second solder section 15 that connects with the terminal 31 of the thermolabile electronic component 30. According to this structure, the previously mentioned problem of using the Sn—Zn solder material (the second solder section 15), i.e., a decrease in joint strength due to the interaction between copper and zinc, is prevented. Thus, the thermolabile electronic component 30 as well as the heat-resistant electronic component chip 20, can be reliably soldered by using the lead-free solder material. As a result, expensive gold plating layers required for enhancing reliability become no longer necessary and substantial cost reduction can be achieved. Moreover, since the first solder sections 14 can be simultaneously formed on both the first solder land 11 and the second solder land 12, a separate step of forming an underlayer on the second solder land 12 is no longer necessary. The number of process steps can be reduced.

In the above-described embodiment, the first solder sections 14 are formed on the first solder land 11 and the second solder land 12 by printing. Alternatively, the first solder sections 14 may be formed on the first solder land 11 and the second solder land 12 by dip soldering.

Furthermore, in the above-described embodiment, the first solder sections 14 are composed of a Sn—Ag—Cu solder material containing no additives. The scope of the invention is not limited to this. For example, a Sn—Ag—Cu solder material containing a minute amount of at least one of antimony, nickel, phosphorus, germanium, and gallium may be used. Moreover, the first solder sections 14 may be composed of a Sn—Ag solder material containing a minute amount of at least one of antimony, nickel, phosphorus, germanium, gallium, aluminum, cobalt, chromium, iron, manganese, palladium, and titanium.

Preferably, the amount of the additive contained in the Sn—Ag—Cu solder material or the Sn—Ag solder material is approximately 0.1 percent by weight. The melting point of the solder materials is preferably approximately 220° C. When the first solder sections 14 are composed of the Sn—Ag—Cu solder material containing antimony or nickel or the Sn—Ag solder material containing antimony or nickel, the thermal fatigue characteristics are further improved. When the first solder sections 14 are composed of a Sn—Ag—Cu or Sn—Ag solder material containing phosphorus, germanium, gallium, or the like, reliability of soldering can be improved since oxidation is inhibited.

What is claimed is:

1. A method for soldering an electronic component, the method comprising:

(a) forming a first solder land, which is a patterned conductor, containing copper and a second solder land, the first solder land and the second solder land being formed on the same surface of a circuit board;

(b) forming a first solder section on each of the first solder land and the second solder land, the first solder section comprising a Sn—Ag—Cu solder material;

(c) mounting a terminal of an electronic component chip on the first solder land;

(d) heating the first solder land and the terminal to connect each other by fusion bonding;

(e) forming a second solder section on the first solder section disposed on the second solder land, the second solder section comprising a Sn—Zn solder material;

(f) inserting a lead terminal of another electronic component into a terminal hole formed near the second solder land; and (g) heating the second solder section and the lead terminal at a temperature lower than a temperature in step (d) so as to connect the lead terminal to the second solder section by fusion bonding.

2. A method for soldering an electronic component, the method comprising:

(a) forming a first solder land, which is a patterned conductor, containing copper and a second solder land, the first solder land and the second solder land being formed on the same surface of a circuit board;

(b) forming a first solder section on each of the first solder land and the second solder land, the first solder section comprising Sn—Ag—Cu solder material containing at least one additive selected from the group consisting of antimony, nickel, phosphorus, germanium, and gallium;

(c) mounting a terminal of an electronic component chip on the first solder land;

(d) heating the first solder land and the terminal to connect each other by fusion bonding;

(e) forming a second solder section on the first solder section disposed on the second solder land, the second solder section comprising a Sn—Zn solder material;

(f) inserting a lead terminal of another electronic component into a terminal hole formed near the second solder land; and (g) heating the second solder section and the lead terminal at a temperature lower than a temperature in step (d) so as to connect the lead terminal to the second solder section by fusion bonding.

3. A method for soldering an electronic component, the method comprising:

(a) forming a first solder land, which is a patterned conductor, containing copper and a second solder land, the first solder land and the second solder land being formed on the same surface of a circuit board;

(b) forming a first solder section on each of the first solder land and the second solder land, the first solder section comprising Sn—Ag solder material containing at least one additive selected from the group consisting of antimony, nickel, phosphorus, germanium, gallium, aluminum, cobalt, chromium, iron, manganese, palladium, and titanium;

(c) mounting a terminal of an electronic component chip on the first solder land;

(d) heating the first solder land and the terminal to connect each other by fusion bonding;

(e) forming a second solder section on the first solder section disposed on the second solder land, the second solder section comprising a Sn—Zn solder material;

(f) inserting a lead terminal of another electronic component into a terminal hole formed near the second solder land; and (g) heating the second solder section and the lead terminal at a temperature lower than a temperature in step (d) so as to connect the lead terminal to the second solder section by fusion bonding.

* * * * *